US006465793B1

(12) United States Patent
Anders

(10) Patent No.: US 6,465,793 B1
(45) Date of Patent: Oct. 15, 2002

(54) ARC INITIATION IN CATHODIC ARC PLASMA SOURCES

(75) Inventor: Andre Anders, Albany, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/540,677

(22) Filed: Mar. 31, 2000

Related U.S. Application Data

(60) Provisional application No. 60/127,200, filed on Mar. 31, 1999.

(51) Int. Cl.[7] .......................... B01D 59/44; H01J 49/00; H01J 7/24; H01J 27/00; H05B 31/26
(52) U.S. Cl. ..................... 250/426; 315/111.7; 250/298
(58) Field of Search ................................. 250/298, 426; 204/298.41; 315/111.2, 111.5, 111.7

(56) References Cited

U.S. PATENT DOCUMENTS

| | | | | |
|---|---|---|---|---|
| 4,252,605 A | * | 2/1981 | Schaffer | 310/10 |
| 4,269,658 A | * | 5/1981 | Ohkawa | 376/125 |
| 4,596,945 A | * | 6/1986 | Schumacher et al. | 250/426 |
| 4,627,086 A | * | 12/1986 | Kato et al. | 378/119 |
| 4,994,706 A | * | 2/1991 | Leung et al. | 313/231.01 |
| 5,433,836 A | * | 7/1995 | Martin et al. | 204/192.38 |
| 5,580,429 A | * | 12/1996 | Chan et al. | 204/192.38 |
| 6,359,388 B1 | * | 3/2002 | Petrmichl | 250/423 R |

* cited by examiner

Primary Examiner—Jack Berman
Assistant Examiner—Johnnie L. Smith, II
(74) Attorney, Agent, or Firm—Henry P. Sartorio

(57) ABSTRACT

A "triggerless" arc initiation method and apparatus is based on simply switching the arc supply voltage to the electrodes (anode and cathode). Neither a mechanical trigger electrode nor a high voltage flashover from a trigger electrode is required. A conducting path between the anode and cathode is provided, which allows a hot spot to form at a location where the path connects to the cathode. While the conductive path is eroded by the cathode spot action, plasma deposition ensures the ongoing repair of the conducting path. Arc initiation is achieved by simply applying the relatively low voltage of the arc power supply, e.g. 500 V–1 kV, with the insulator between the anode and cathode coated with a conducting layer and the current at the layer-cathode interface concentrated at one or a few contact points. The local power density at these contact points is sufficient for plasma production and thus arc initiation. A conductive surface layer, such as graphite or the material being deposited, is formed on the surface of the insulator which separates the cathode from the anode. The mechanism of plasma production (and arc initiation) is based on explosive destruction of the layer-cathode interface caused by joule heating. The current flow between the thin insulator coating and cathode occurs at only a few contact points so the current density is high.

14 Claims, 7 Drawing Sheets

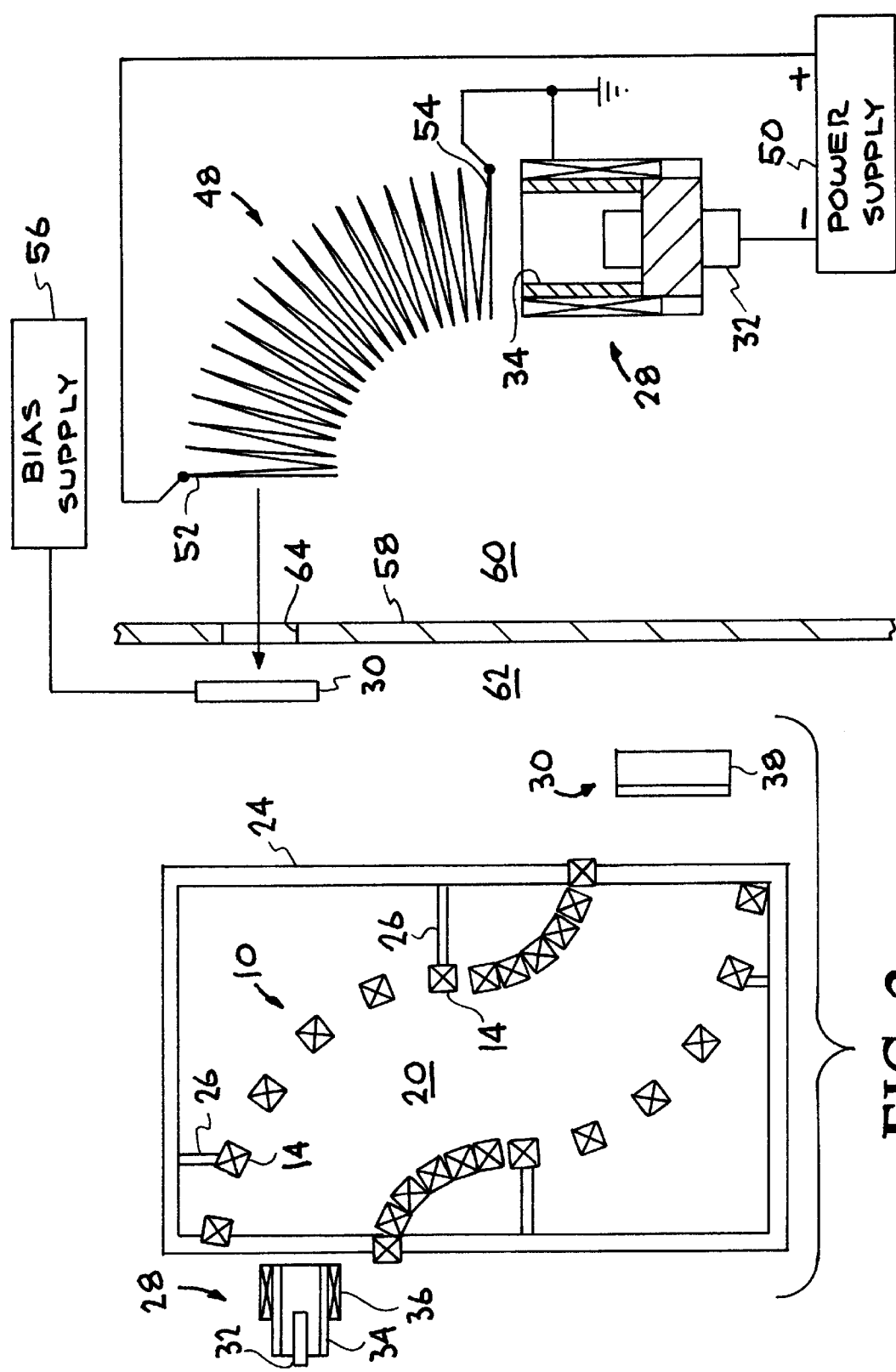

ARC INITIATION IN CATHODIC ARC PLASMA SOURCES

RELATED APPLICATIONS

This application claims priority of Provisional Application Ser. No. 60/127,200 filed Mar. 31, 1999, which is herein incorporated by reference.

GOVERNMENT RIGHTS

The United States Government has rights in this invention pursuant to Contract No. DE-AC03-76SF00098 between the United States Department of Energy and the University of California.

BACKGROUND OF THE INVENTION

The invention relates to cathodic arc plasma sources, and more particularly to method and apparatus for the initiation of the cathodic arc.

Cathodic arc plasma deposition is a coating technology with great potential. Most importantly, cathodic arc plasmas are fully ionized and can therefore be manipulated with electric and magnetic fields. While electric fields are used to change the ion energy and thus the structure and properties of deposited films, magnetic fields are used to guide and homogenize the plasma.

However, a major obstacle to the broad application of cathodic arc plasma coating is the presence of macroparticles in the plasma, where macroparticles broadly encompasses all particles much larger than the ions, including droplets, microparticles, and nanoparticles.

Cathodic arc current is localized in minute nonstationary cathode spots. Spot formation is necessary to provide sufficient power density for plasma formation, electron emission, and current transport between the cathode and anode. Macroparticles originate from plasma-solid interaction at cathode spots.

Many approaches have been proposed and tested to eliminate macroparticles from cathodic vacuum arc plasmas. Most successful are curved magnetic filters, originally introduced by Aksenov and co-workers in the late 1970s. Although high-quality metal, metal-compound, and diamond-like carbon films have been synthesized by filtered cathodic arc deposition, macroparticle filters suffer from two major drawbacks: (1) the plasma transport is inefficient, i.e. only a fraction of the original (unfiltered) plasma is actually useable for film deposition, and (2) the removal of macroparticles is not complete. The latter is particularly pronounced for solid macroparticles as observed with cathodic arc carbon plasmas.

The design of macroparticle filters depends first and foremost on the mode of arc operation. DC arc plasma sources are usually equipped with cathodes of large size, e.g. diameter of 3–5 cm. The spot location may be magnetically controlled. In any case, the location(s) of plasma production, the micron-size cathode spot(s), can vary across the cathode surface, and the cross section of the filter entrance must be large enough to accommodate the various spot locations. A large filter entrance necessarily implies a large filter in length, volume, and weight. However, the plasma density in the filter drops exponentially with the path length of the filter.

Most filters, and virtually all of the DC-operated filters, have a "closed" architecture in the sense that the filter volume is enclosed by a tube or duct which is surrounded by magnetic field coils. Macroparticles cannot leave the filter volume. They are expected to stick to the duct wall or to be caught between baffles that are placed inside the duct. The ducts are preferably bent, e.g. at 45° or 90°, so there is no line-of-sight from the arc spot to the substrate.

U.S. Pat. No. 6,031,239 shows a filtered cathodic arc source with a filter of closed architecture having a toroidal duct with two bends, preferably in different planes, and a liner or baffle in the duct. The double bend provides no line-of-sight and no single bounce path through the duct. The duct is relatively large, with a diameter of 4–6 inches.

However, catching macroparticles is difficult for some cathode materials such as carbon because the macroparticles tend to be elastically reflected from surfaces. This "bouncing" problem is addressed by filters with open architecture where "bouncing" is used to let macroparticles escape from the region of plasma transport. Filters of open architecture do not have a duct but consist of a few turns of a magnetic field coil. The coil must have a relatively high current to generate sufficient field strength despite the small number of turns per length. For convenience, the arc current can be used in the filter coil.

Thus a short, open-architecture magnetic filter in combination with a compact arc source with a cathode of small area and operated in pulsed mode is desirable in order to have a high throughput of clean plasma to a deposition target.

SUMMARY OF THE INVENTION

Accordingly it is an object of the invention to provide an improved method and apparatus for arc initiation in a cathodic arc plasma source.

The invention is a "triggerless" arc initiation method and apparatus based on simply switching the arc supply voltage to the electrodes (anode and cathode). Neither a mechanical trigger electrode nor a high voltage flashover from a trigger electrode is required. A conducting path between the anode and cathode is provided, which allows a hot spot to form at a location where the path connects to the cathode. The resistance of the path is preferably in the 1Ω–10 kΩ range. While the conductive path is eroded by the cathode spot action, plasma deposition ensures the ongoing repair of the conducting path.

Arc initiation is achieved by simply applying the relatively low voltage of the arc power supply, e.g. 500 V–1 kV, with the insulator between the anode and cathode coated with a conducting layer and the current at the layer-cathode interface concentrated at one or a few contact points. The local power density at these contact points is sufficient for plasma production and thus arc initiation.

A conductive surface layer, such as graphite or the material being deposited, is formed on the surface of the insulator which separates the cathode from the anode. The mechanism of plasma production (and arc initiation) is based on explosive destruction of the layer-cathode interface caused by joule heating. The current flow between the thin insulator coating and cathode occurs at only a few contact points so the current density is high.

A cathodic arc plasma deposition system using a source with this triggerless arc initiation system can be used for the deposition of ultrathin amorphous hard carbon (a-C) films for the magnetic storage industry.

BRIEF DESCRIPTION OF THE DRAWINGS

FIG. 2 is a cross-sectional view of a planar S-filter of the invention mounted in a support frame and positioned between a cathodic arc source and a substrate.

FIG. 4 shows the electrical connection of a magnetic filter and cathodic arc plasma source to a cathodic arc power supply.

DETAILED DESCRIPTION OF THE INVENTION

The invention is an improved magnetic filter for removing macroparticles from the plasma produced by cathodic arc sources. The filter is formed of a bent solenoidal coil with an open-architecture, preferably with at least one of the following additional features: (1) additional field coils at the filter entrance and exit, and (2) coil turns having a flat cross-section to promote macroparticle reflection out of the filter volume.

In particular, the invention includes a three-dimensional double-bent solenoid filter or twist filter with the two bent sections of an S-shaped coil twisted out of plane. The filter turns are held at numerous points by a support structure to provide cooling and stability. The invention also applies to planar S-filters and to single bend filters such as 90° filters.

Figure 1A:
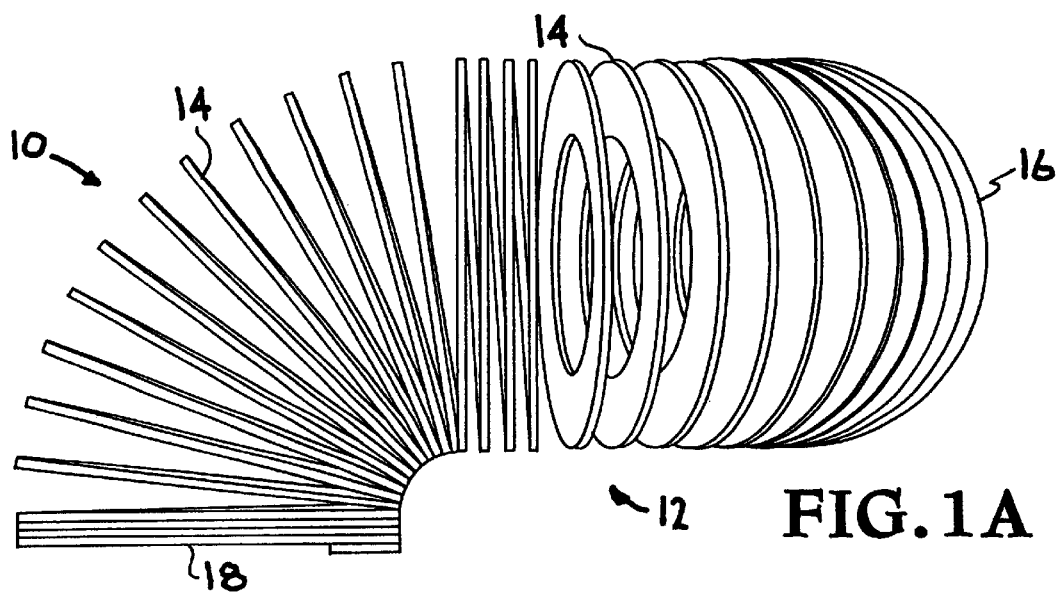
FIGS. 1A–C are three side views of a twist filter of the invention.
Figure 1B:
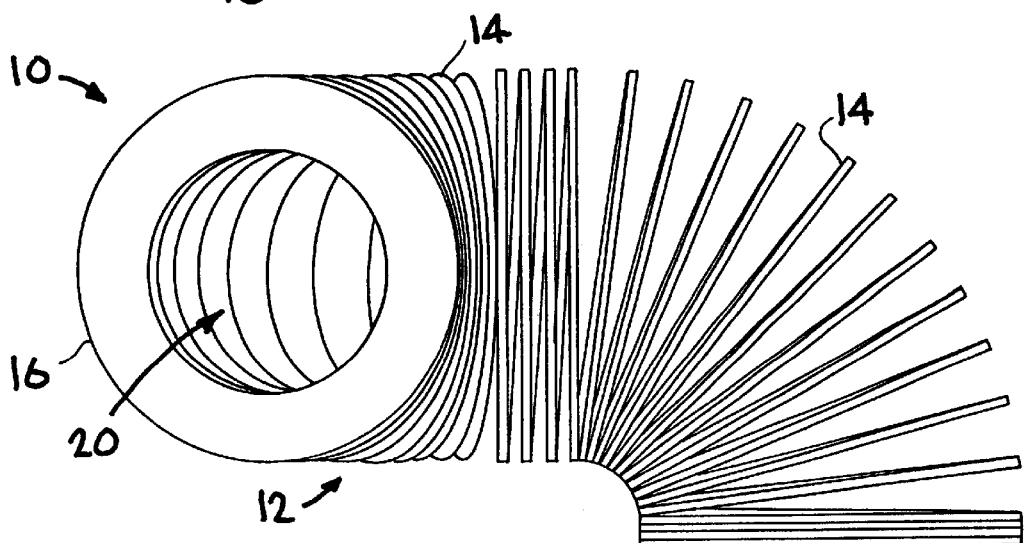
Figure 1C:
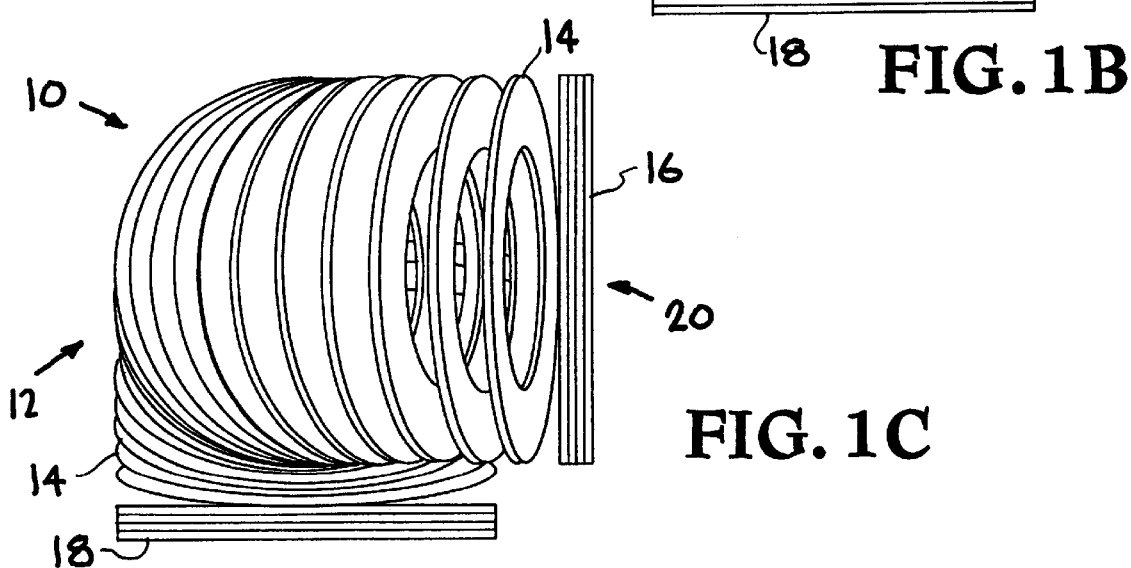

As illustrated in FIGS. 1A–C, a magnetic filter 10 of the invention is formed of a twisted solenoidal coil 12 made up of a series of windings or turns 14 extending from a first end 16 to a second end 18. FIGS. 1A–C show three views of the filter 10 rotated about a vertical axis 90° or 180° from each other, with first end 16 facing back in FIG. 1A, facing forward in FIG. 1B, and facing the right in FIG. 1C. Coil windings or turns 14 are made of conductive material, e.g. copper, and coated with an insulator, e.g. lacquer, so that current can flow through the coil from one end to the other to produce a magnetic field to guide plasma ions through the filter volume 20 defined inside coil 12.

Coil windings or turns 14 are substantially flat, preferably knife edges, so that only the thin edges face the filter volume 20. Thus, the chances of macroparticles in the plasma hitting the edges of windings or turns 14, and being reflected within the filter volume 20, are greatly reduced. Instead, macroparticles are much more likely to pass through the spaces between windings or turns 14, and thus be removed from the plasma. The coil windings or turns 14 will act as baffles; if the macroparticles hit the flat surfaces of the coil winding or turns 14, they will be reflected out of the filter 10.

Filter 10 has a double bend shape with an out of plane twist so that there is no line of sight and no single reflection path through the filter volume 20. It is extremely unlikely that any macroparticle can be multiply reflected within the filter and exit the filter with the plasma, particularly if the flat coil winding configuration is used. While the twist filter configuration is the best design, other filters may be planar in configuration and have only a single bend. While flat coil windings are preferred, round or other shaped windings may be used.

A compact filter designed for use with a compact cathodic arc plasma source is desired. The length of the plasma path through the filter may be short, e.g. 20 cm or less. The diameter of the filter coil may be small, e.g. 3 cm inside diameter. The magnetic field inside the coil is relatively strong, e.g. at least 50 mT.

Operation of the open architecture twist filter at high current, e.g. about 1 kA, requires stabilization of the coil windings or turns because of the electromagnetic forces exerted on the coils. As shown in FIG. 2, magnetic filter 10 is mounted in a support structure 24 which has support elements 26 to which coil windings or turns 14 are attached. Thus the magnetic filter 10 can be maintained in position between cathodic arc source 28 and substrate 30 so that a plasma beam will pass through filter volume 20 and the filtered plasma will be deposited on substrate 30. Cathodic arc source 28 has a cathode 32 inside an anode 34. The cathodic arc source 28 is located close to the entrance to filter 10, e.g. the surface of cathode 32 is preferably located at a distance of 0.5 to 2 times the inner diameter of the filter coil from the filter entrance. Cathodic arc source 28 may also include a focusing or injection solenoid 36 to increase the plasma output from the source into the filter. Substrate 30 is supported on a mount 38 which may include an x-y translation stage for scanning a workpiece across the filtered plasma beam.

Figure 3A:
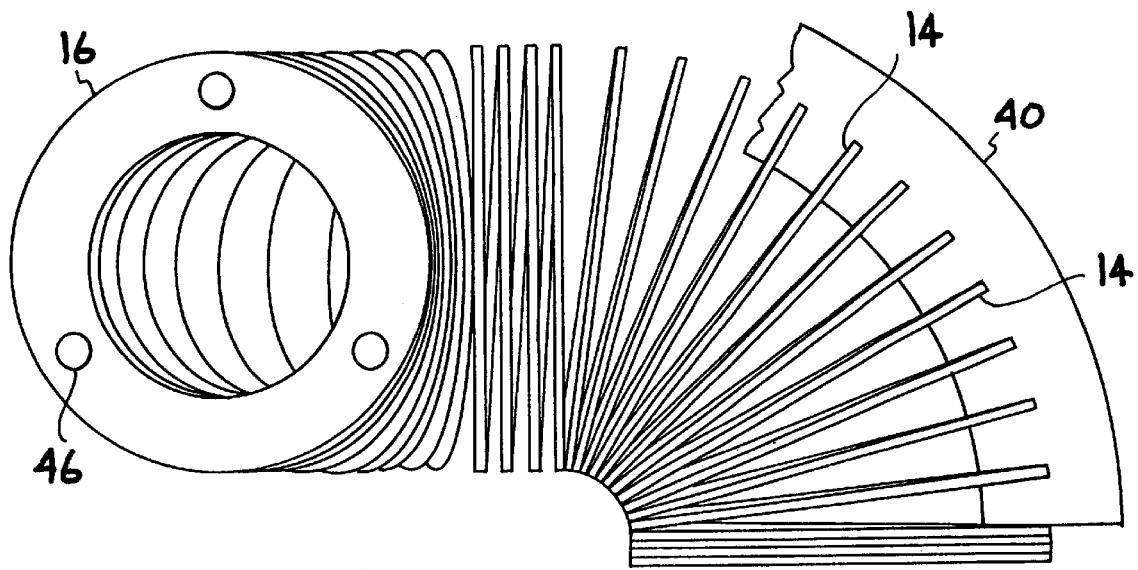
FIGS. 3A–B show two types of separators between the windings of a twist filter.
Figure 3B:
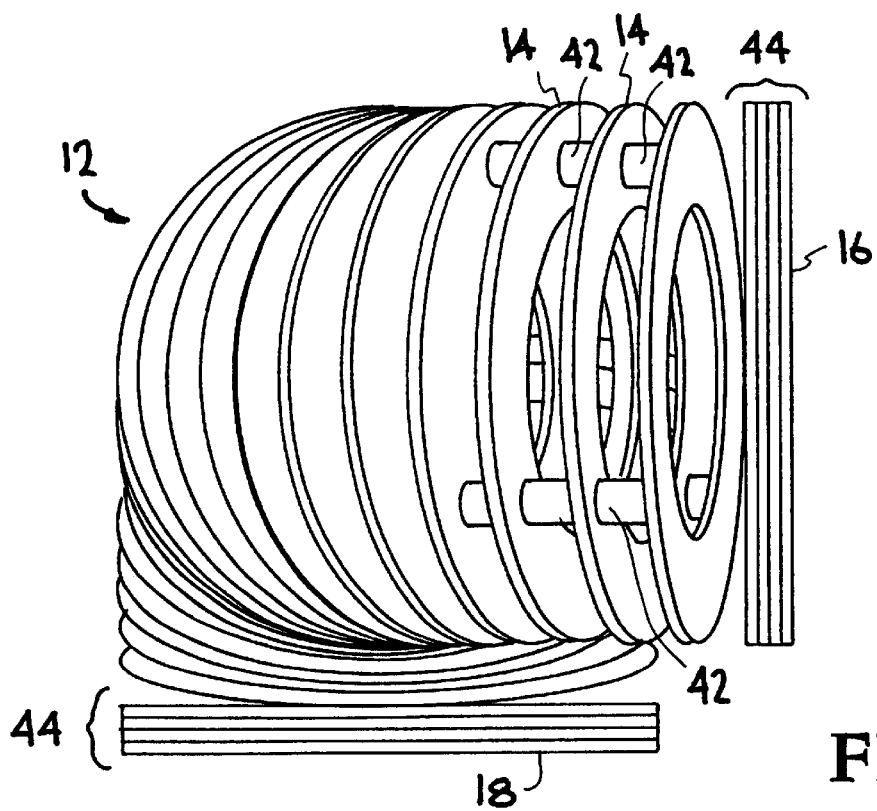

FIGS. 3A, B illustrate other ways to stabilize the filter with holding structures connecting all of the coil windings or turns together while maintaining the open structure. Thin bands 40 of stiff, high temperature, high resistance material, e.g. 0.1 mm thick stainless steel sheet, can connect each winding or turn 14 and be connected to each other, as shown in FIG. 3A. Alternatively, a plurality of struts 42 formed of insulators such as fiberglass, Kevlar, Teflon, or Kapton, or ceramic tubes can be used as separators between windings or turns 14, as shown in FIG. 3B. Holes 46 for three struts 42 are shown on the coil end 16 in FIG. 3A.

In another aspect of the invention, as illustrated in FIG. 3B, the ends 16, 18 of filter coil 12 have a group 44 of closely spaced extra windings or turns. The extra windings or turns compensate for the normally occurring drop in magnetic field strength at the ends of the coil. For example, in a 90° bent magnetic filter with 23 turns, two additional turns are added at both the entrance and exit.

The cathodic arc plasma source and filter can be operated in series from a single power supply, i.e. the arc and the coil can be electrically connected in series so that the arc current generates the guiding magnetic field in the filter. Thus the coil current, which equals the arc current, is very high, preferably at least 1 kA.

As shown in FIG. 4, plasma source 28 and magnetic filter 48, which is shown as a 90° filter but can be any other geometry, are electrically connected in series to an arc current power supply 50. The power supply 50 is connected between the cathode 32 of source 28 and the exit end 52 of filter 48. The anode 34 of source 28 and entrance end 54 of filter 48 are connected together, and grounded. One advantage of this arrangement is that the plasma potential at the exit end 52 of the filter is positive with respect to ground, which is equivalent to negatively biasing the substrate 30 to which the plasma beam is directed. In both cases the plasma ions are accelerated to the substrate. By achieving a positive plasma potential, the substrate can simply be grounded and ions still experience acceleration to the substrate. thus in effect the plasma is biased instead of the substrate. Of course, substrate 30 can be additionally biased by connection to a bias supply 56 for additional manipulation of the ion energy.

An additional feature shown in FIG. 4 is that the source 28 and filter 48 can be separated from the substrate 30 by a particle blocking wall 58. Wall 58 functions as a macroparticle firewall which separates the macroparticle contaminated source and filter chamber 60 from the clean plasma process chamber 62. The opening 64 in wall 58 through which the filtered plasma can enter chamber 62 can be kept small. Ideally the wall 58 is very close to the end of filter 48 so all the plasma passes through opening 64.

Figure 5:
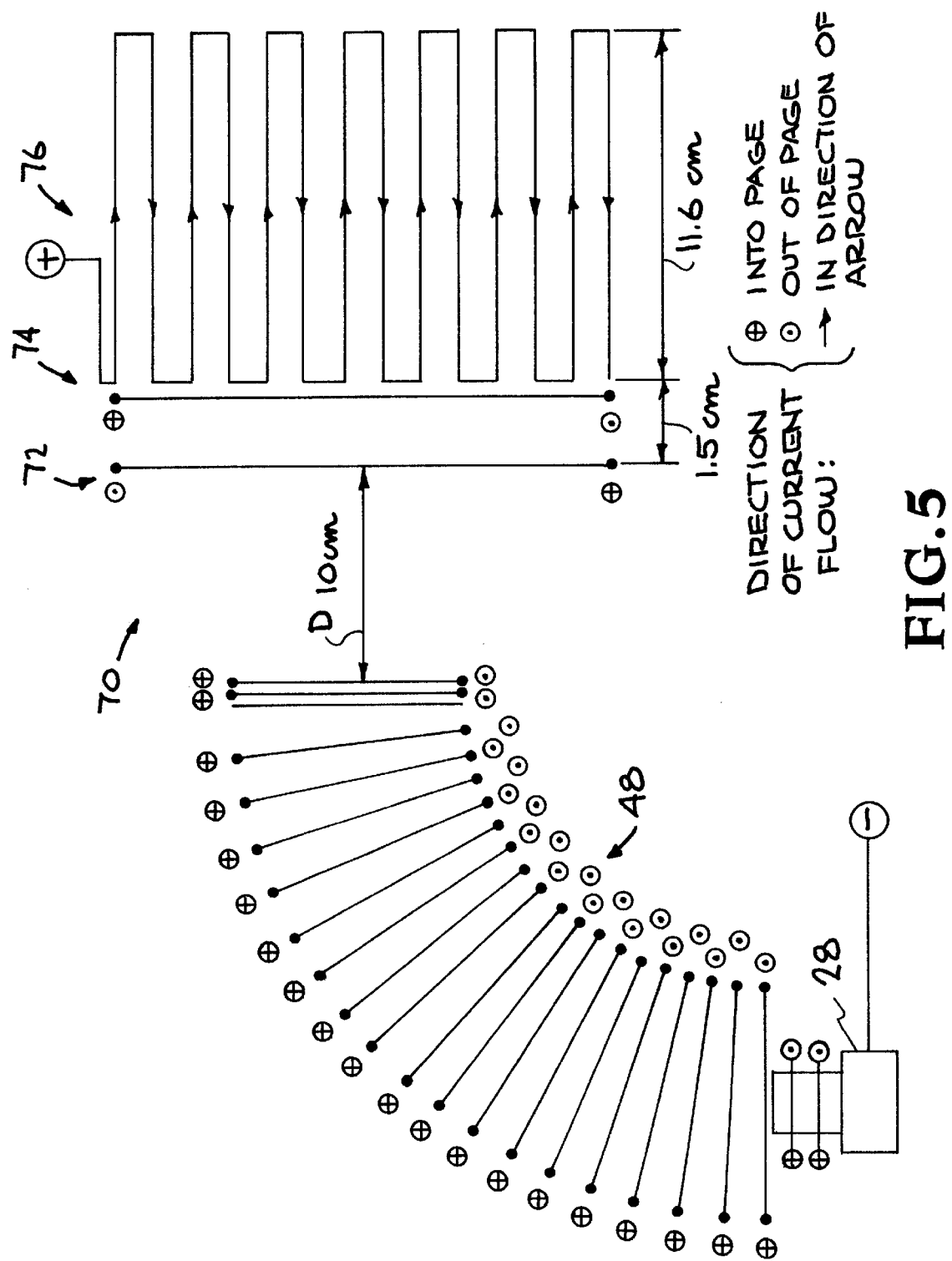
FIG. 5 illustrates an output conditioning system for expanding the filtered plasma beam at the output of a magnetic filter.

Magnetic guiding of the plasma at the filter output can be used to spread the plasma beam and distribute it evenly over a larger target area, e.g., 4 inch diameter. The system of coils and wires is compact, having a length of less than 20 cm, and allows the retention of a much greater portion of the plasma. As shown in FIG. 5, filter output conditioning system combines three components, an expander coil 72, a straightening coil 74, and a multipole magnetic homogenizer 76.

In order to expand the magnetic field lines as soon as they leave the magnetic filter 48, expander coil 72 is positioned near the filter output, e.g. at 10 cm. Coil 72 is a large diameter coil which produces a magnetic field in the opposite direction to that of filter 48. This opposing field couples with the filter field to produce a weak field region where the field lines expand rapidly, allowing the plasma beam to diverge.

The final stage is homogenizer 76 which produces the same magnetic field configuration as a permanent magnet homogenizer. However, in homogenizer 76 the magnetic fields are produced by current carrying wires wound in a square-wave zig-zag pattern around an insulating tube, e.g. plexiglass, about 12 cm long, and carrying the full arc current. This design is cheaper than a permanent magnet system and produces strong magnetic fields when operated at high current, e.g. 1 kA. However, a permanent magnet homogenizer may also be used with an electromagnetic expander and staightener.

Plasma losses in the homogenizer can be minimized if the field lines pass through the homogenizer parallel to its walls. To make the expanded lines from expander 72 parallel as they enter homogenizeer 76, straightener 74 is positioned in between. The straightener 74 is another coil which produces a magnetic field parallel to that of the filter 48. The expander 72 and straightener 74 together expand and funnel the plasma into homogenizer 76 over a distance of about 10–12 cm. Operation of the coil pair was optimized using a current divider with a current ratio of 2:1 so that ⅔ of the arc current passed through the expander and ⅓ through the straightener.

Figure 6:
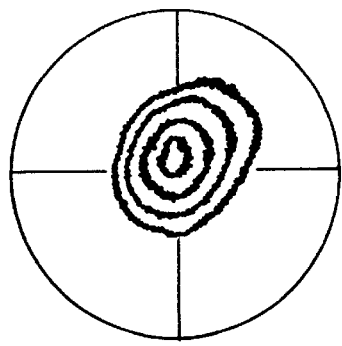
FIG. 6 shows the plasma distribution at the exit plane of a twist filter.

FIG. 6 shows the plasma distribution at the exit plane of a twist filter. The reference circle has a diameter of 30 mm corresponding to the inner diameter of the filter coil. The plasma is concentrated in a narrow, magnetically confined channel a few millimeters in diameter (the fringes are a result of signal processing).

Figure 7:
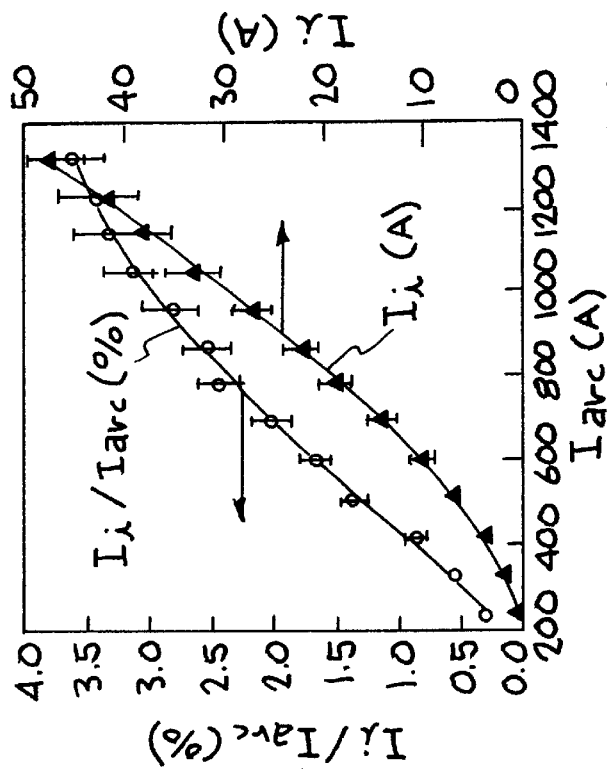
FIG. 7 shows the normalized and absolute total ion current of twist filtered carbon plasma as a function of arc current.

FIG. 7 shows the normalized and absolute total ion current of twist-filtered carbon plasma, measured with a large-area ion collector biased at −70 V, as a function of the arc current. The ratio of filtered ion current to arc current can be defined as the "system coefficient" characterizing the coupled source and filter system. System coefficients of 1% are generally considered good. FIG. 7 indicates that the absolute output increases at least linearly with arc current while the system coefficient tends to saturate at high arc currents. This can be explained since plasma production at cathode spots is approximately proportional to the arc current and plasma transport in the filter is improved at higher field strength. The saturation of the system coefficient indicates that the system is approaching the limits of theoretically possible plasma transport. The non-saturation of the absolute filtered ion current indicates that even higher filtered currents can be achieved, if needed.

Thus a compact miniaturized filter is provided which efficiently removes macroparticles from the plasma and provides high plasma throughput. To utilize this filter a compact cathodic arc source with a cathode of small area is required. A problem with a small cathode is limited lifetime due to cathode erosion as the cathode material is consumed to form the plasma. Thus a cathode feed mechanism is required. A short filter with an open architecture and high current, and a compact source with small cathode, also indicate a repetitively pulsed mode of operation rather than DC. A miniaturized cathodic arc plasma source which meets these requirements forms a part of the invention.

Figure 8:
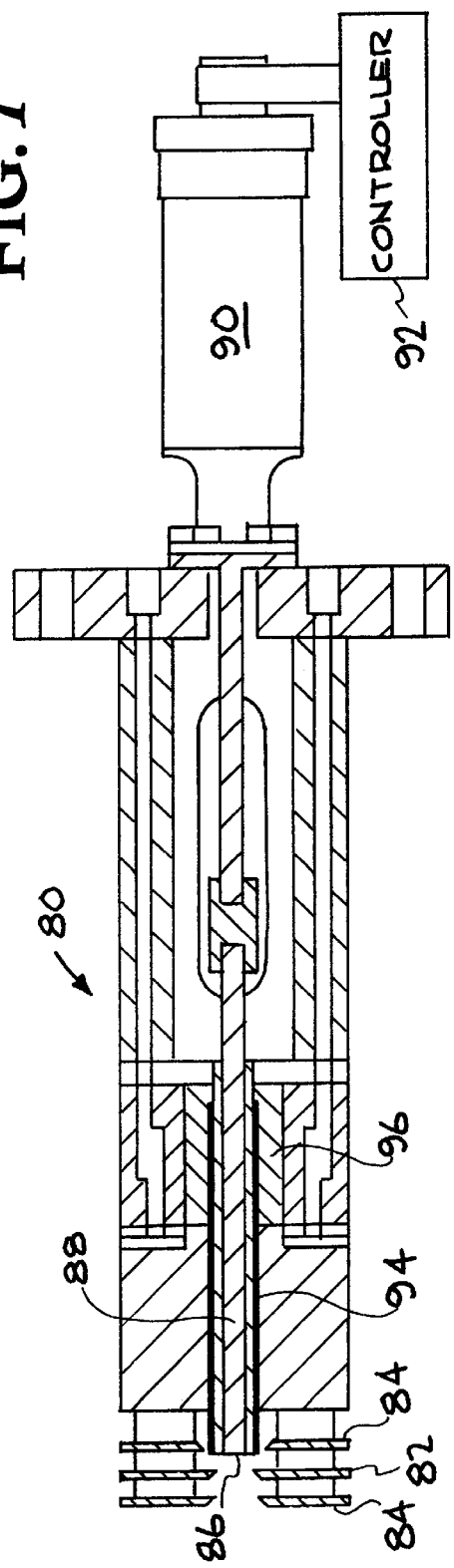
FIG. 8 shows a miniaturized cathodic arc plasma source of the invention.

As shown in FIG. 8, cathodic arc plasma source 80 has an anode 82 formed of a plurality of spaced baffles 84 which extend beyond the active cathode surface 86 of cathode 88. In the prior art sources where the anode is a cylinder housing the cathode assembly, most macroparticles generated at the cathode are ejected at shallow angles with respect to the cathode surface, and either stick to the anode or are reflected back into the plasma. With the open baffle structure of anode 82 of source 80, most macroparticles pass through the gaps between baffles 84 and reflect off baffles 84 out of the plasma stream that enters the filter. Thus the anode not only has an electrical function but serves as a prefilter.

The cathode 88 of source 80 has a small diameter, e.g. a rod of about ¼ inch (6.25 mm) diameter compared to the common 2–3 inch DC cathodes. Thus the plasma source output is well localized, even with cathode spot movement which is limited in area, so that it effectively couples into a miniaturized filter.

With a small area cathode, the material eroded from the cathode needs to be replaced to maintain plasma production. Therefore, source 80 includes a cathode advancement or feed mechanism 90 coupled to cathode (rod) 88. Feed mechanism 90 may simply be a manual feed mechanism such as a micrometer, but preferably is a motorized feed mechanism automatically controlled by a controller 92. For example, using graphite and an arc current of 1.5 kA and a pulse width of 600 $\mu$s, the cathode must be advanced by 0.4 $\mu$m/pulse, or the cathode must be advanced about 1 mm for every 1000 arc pulses of about 1 kA current and 1 ms duration for a carbon cathode.

Cathode 88 of source 80 also requires a cooling mechanism. The movable cathode (rod) 88 is housed in a cooled metal shield or tube 94 which serves as both a current conductor, thus reducing ohmic heat produced in the cathode, and as the heat sink for heat generated at or near the cathode. Cooling of the cathode housing tube 94 is done by contact with coolant 96 at a place remote from the active cathode surface 86.

Source 80 is operated in pulsed mode at relatively high currents, about 1 kA. The high arc current can also be used to operate the magnetic filter. Power consumption and associated heat load can thus be regulated via the arc pulse duty cycle and pulse length rather than arc current which would lower the filter field.

Pulsed operation of the cathodic arc source requires a reliable arc trigger mechanism with a long lifetime. The invention includes a "triggerless" arc initiation method and apparatus based on simply switching the arc supply voltage to the electrodes (anode and cathode). Neither a mechanical trigger electrode nor a high voltage flashover from a trigger electrode is required. A conducting path between the anode and cathode is provided, which allows at least one hot spot to form at locations where the path connects to the cathode. The location can vary with each pulse but reliably occur every pulse. The resistance of the path is preferably in the $1\Omega$–$10$ k$\Omega$ range. While the conductive path is eroded by the cathode spot action, plasma deposition ensures the ongoing repair of the conducting path.

Arc initiation is achieved by simply applying the relatively low voltage of the arc power supply, e.g. 500 V–1 kV, with the insulator between the anode and cathode coated with a conducting layer and the current at the layer-cathode interface concentrated at one or a few contact points. The local power density at these contact points is sufficient for plasma production and thus arc initiation.

Figure 9B:
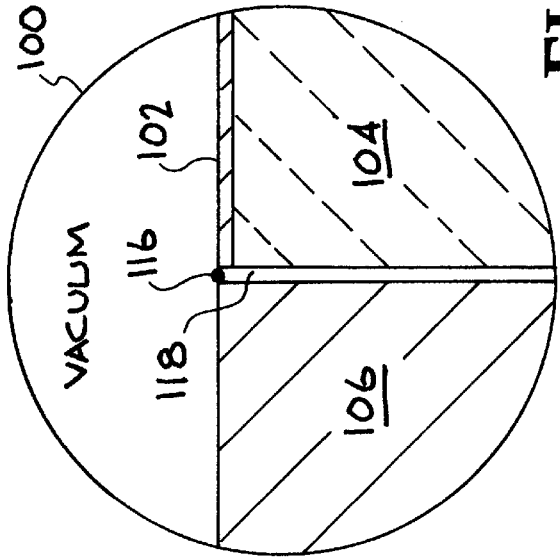
FIGS. 9B, C show side and top enlarged views of the cathode-insulator junction.
Figure 9C:
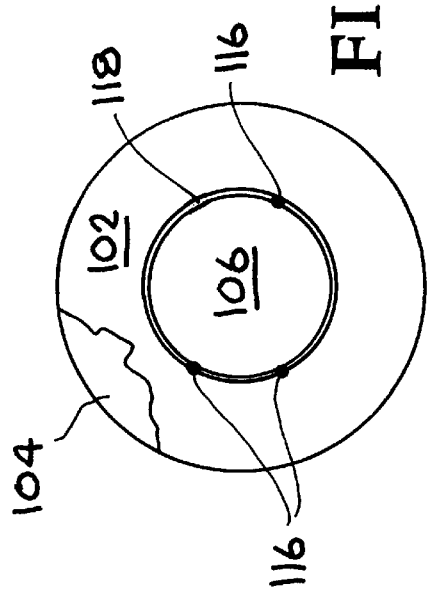
FIG. 9A shows a system for "triggerless" cathodic arc initiation.
FIG. 9D shows a power supply with booster for the triggerless arc initiation.
FIG. 9E shows a power supply for the triggerless arc initiation based on a thyristor switched pulse forming network (PFN).
Figure 9A:
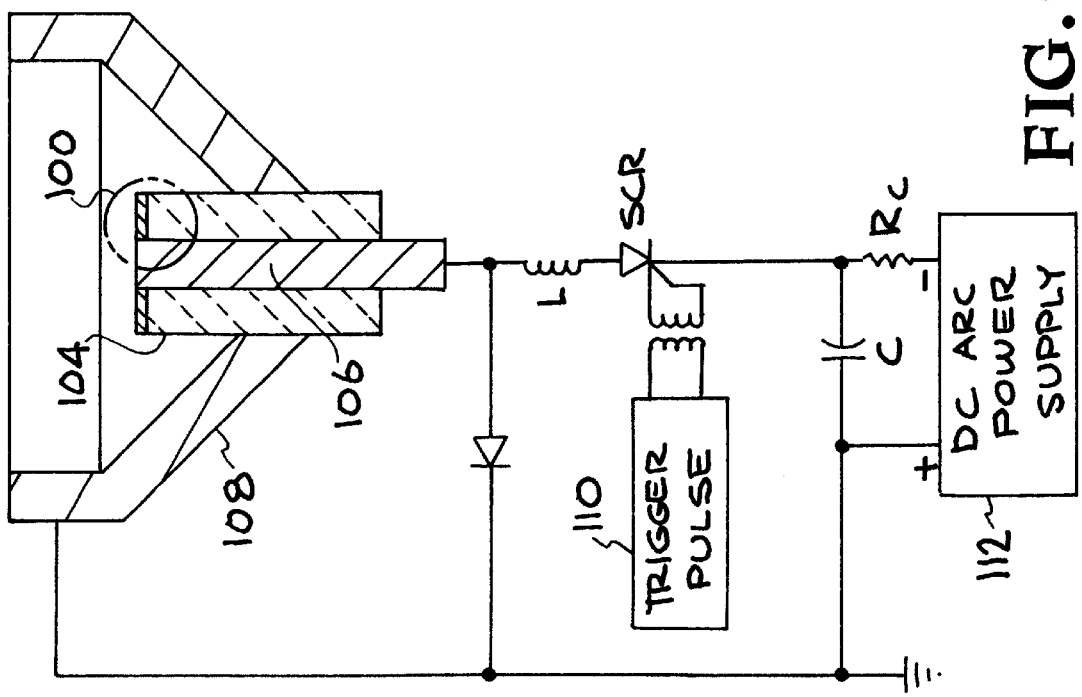

As shown in FIG. 9A and the enlarged views of the interface 100 in FIGS. 9B,C a conductive surface layer 102, such as graphite or the material being deposited, is formed on the surface of insulator 104 which separates cathode 106 from anode 108. The mechanism of plasma production (and arc initiation) is based on explosive destruction of the layer 102-cathode 106 interface caused by joule heating. The current flow between the thin insulator coating 102 and cathode 106 occurs at only a few contact points so the current density is high. Spots 116 form at locations at the cathode 106-coated insulator 104 interface, bridging the small gap 118 that inevitably exists between cathode 106 and insulator 104.

A trigger pulse from trigger pulse generator 110 is applied to an SCR or other switch to apply the voltage from arc power supply 112. Rc is the charging resistance and L is the current limiting inductance.

Figure 9D:
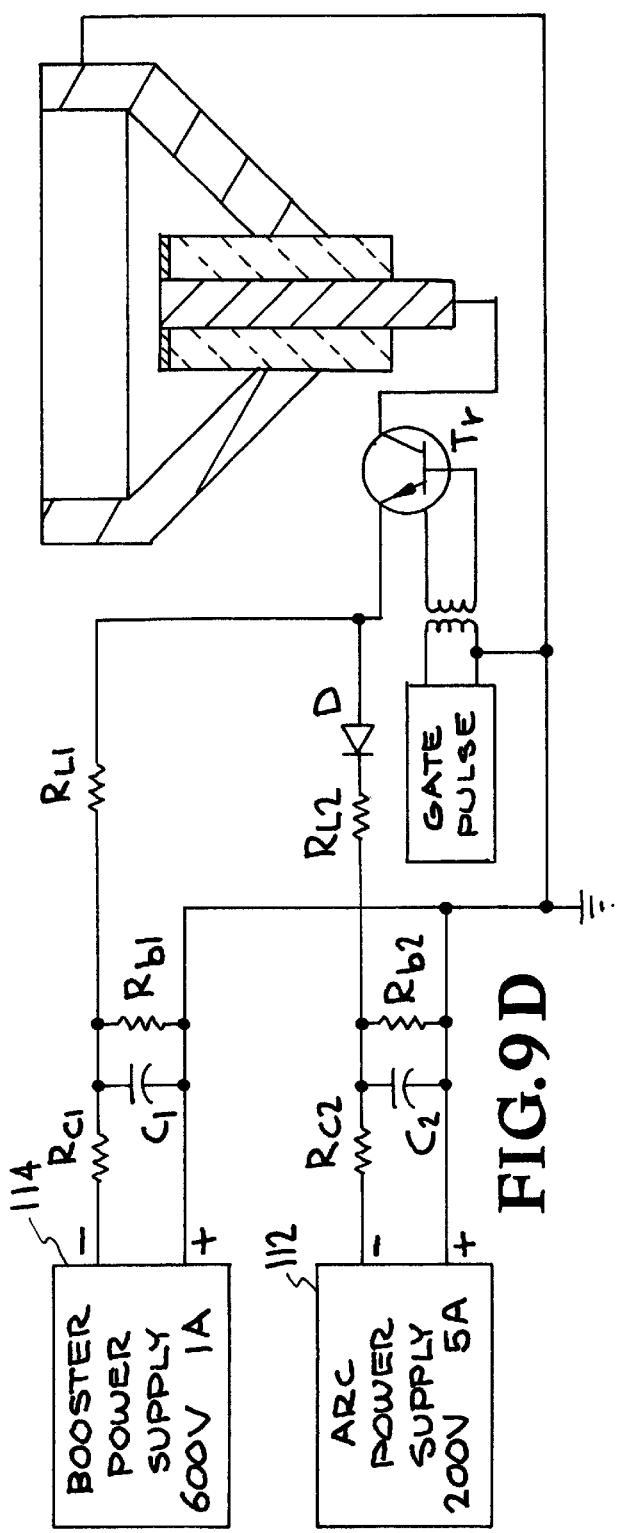

An arc supply with a booster voltage is shown in FIG. 9D. A high current arc power supply 112 is combined with a second supply 114 which boosts the voltage to ensure reliable triggering. Rb1 and Rb2 are bleed resistances for safety, RL1 and RL2 are current limiting resistances, C1=20 $\mu$F, C2=10 mF, D is a high voltage, high current diode preventing backfeeding of supply 114 into supply 112, and Tr is a 200 A/1000V transistor switch.

Figure 9E:
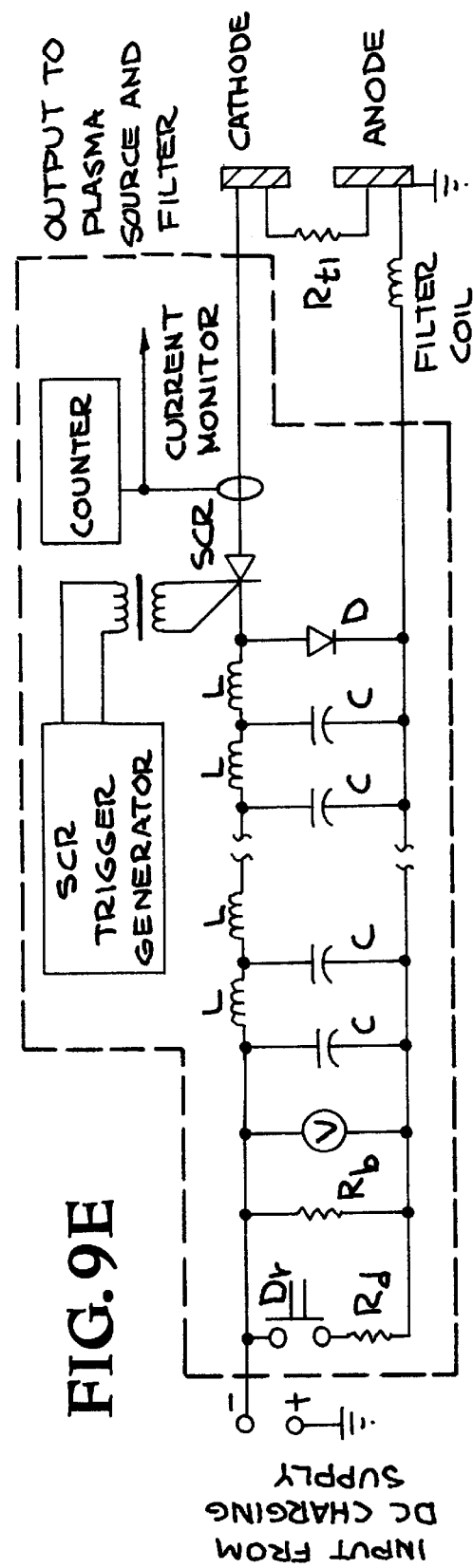

An efficient, compact power supply for pulsed cathodic arcs based on a thyristor switched, high voltage, high current, pulse forming network (PFN) is shown in FIG. 9E. In the circuit, Dr is a safety drop switch, Rd=100 $\Omega$ is a current limiting resistor at the drop switch, Rb=100 k$\Omega$ is a bleeding safety resistor, C=88 $\mu$F, L=7.5 $\mu$H, D is an energy enhancing diode, Rt1 (about 100 $\Omega$) is the resistance of the conducting path between anode and cathode for triggerless arc initiation. The filter coil for macroparticle removal from the cathodic arc plasmas can be used while the anode is grounded; in this case there is no direct connection from the ground of the power supply to the positive side of the capacitors of the PFN.

It can provide high pulsed currents up to 2 kA with a duration of 600 $\mu$s, and pulse repetition rates up to 10 Hz, or higher at lower current. Cathodic arc initiation is reliable because the charging voltage is much higher than the minimum starting voltage for triggerless arc initiation. Energy utilization efficiency is high by intentionally mismatching load and PFN impedances; the stored energy is dissipated primarily in the arc.

The cathodic arc systems of the invention can be used for the deposition of defect free, dense, continuous films for a variety of applications, including protective coatings, decorative coatings, and wear resistive coatings. One example is the deposition of a thin layer of pinhole free, amorphous diamond on magnetic storage media. Other materials than carbon can also be deposited, e.g. magnetic materials. Optical films can also be produced. Another application is the deposition of filtered cathodic arc tantalum, copper or other material into or onto submicron trenches and vias etched in silicon wafers and other semiconductors.

Changes and modifications in the specifically described embodiments can be carried out without departing from the scope of the invention which is intended to be limited only by the scope of the appended claims.

What is claimed is:

1. A method for "triggerless" arc initiation in a cathodic arc source having an anode and a cathode separated by an insulator, comprising:

providing a conducting path between the anode and cathode, which allows a hot spot to form at a location where the path connects to the cathode;

switching an arc supply voltage to the anode and cathode.

2. The method of claim 1 wherein the arc supply voltage is about 500 V–1 kV.

3. The method of claim 1 wherein the conductive path is provided by coating the insulator between the anode and cathode with a conducting layer.

4. The method of claim 3 wherein the coating is made of graphite or the material being deposited by the cathodic arc source.

5. Apparatus for "triggerless" arc initiation in a cathodic arc source having an anode and a cathode separated by an insulator, comprising:

a conducting path between the anode and cathode, which allows a hot spot to form at a location where the path connects to the cathode;

an arc power supply connected to the anode and cathode;

a switch for applying a voltage from the arc power supply to the anode and cathode.

6. The apparatus of claim 5 wherein the arc power supply has a voltage of about 500 V–1 kV.

7. The apparatus of claim 5 wherein the conductive path comprises a coating on the insulator between the anode and cathode.

8. The apparatus of claim 7 wherein the coating is made of graphite or the material being deposited by the cathodic arc source.

9. The apparatus of claim 5 further comprising a trigger pulse generator connected to the switch to actuate the switch.

10. The apparatus of claim 5 wherein the switch is a silicon controlled rectifier (SCR).

11. The apparatus of claim 5 wherein the arc power supply comprises a first power supply and a second power supply to boost the voltage of the first supply.

12. The apparatus of claim 5 wherein the arc power supply comprises a pulse forming network (PFN).

13. The apparatus of claim 12 further comprising an energy enhancing diode across the PFN.

14. The apparatus of claim 12 wherein the PFN impedance is mismatched to the load impedance.

* * * * *